(12) United States Patent  
Negle

(10) Patent No.: US 6,498,303 B2
(45) Date of Patent: Dec. 24, 2002

(54) HIGH-VOLTAGE GENERATOR PROVIDED WITH A HYBRID INSULATION

(75) Inventor: Hans Negle, Nahe (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/940,041

(22) Filed: Aug. 27, 2001

(65) Prior Publication Data

US 2002/0020547 A1 Feb. 21, 2002

(51) Int. Cl.$^7$ .............................................. H01B 17/00
(52) U.S. Cl. ................................. 174/138 R; 378/200
(58) Field of Search ........................... 174/8, 10, 14 R, 174/15.1, 17 LF, 138 R, 138 C, 146, 148, 155, 156, 208, 209; 378/200, 201, 202

(56) References Cited

U.S. PATENT DOCUMENTS

| | | | | |
|---|---|---|---|---|
| 4,651,338 A | * | 3/1987 | Hahn | ............................ 378/15 |
| 4,653,591 A | * | 3/1987 | Marshall | ...................... 169/15 |
| 4,767,961 A | * | 8/1988 | Koller et al. | ................... 313/12 |
| 5,228,447 A | * | 7/1993 | Harder et al. | ................ 600/439 |
| 5,497,409 A | | 3/1996 | Jedlitschka et al. | .......... 378/201 |
| 5,704,172 A | * | 1/1998 | Gougeon et al. | .............. 405/45 |
| 5,992,771 A | * | 11/1999 | Noakes et al. | ............... 136/255 |

FOREIGN PATENT DOCUMENTS

JP          0611991      1/1994      ............ H05G/1/06

* cited by examiner

Primary Examiner—Dean A. Reichard
Assistant Examiner—Jinhee Lee
(74) Attorney, Agent, or Firm—John Vodopia

(57) ABSTRACT

The invention relates to a high-voltage generator which is proportioned so as to realize a particularly low weight in combination with a high output power and is suitable notably for use in rotating X-ray systems such as computed tomography apparatus. To this end, the high-voltage generator is provided with a hybrid insulation which is formed as far as possible by a high resistance foam (30 to 35) and an insulating liquid (50). The foam is shaped and arranged in such a manner that there are formed channels (40 to 45) wherethrough the insulating liquid (50) can flow in areas requiring a discharge of heat or an electric strength stronger than can be endured by the high-resistance foam alone.

12 Claims, 1 Drawing Sheet

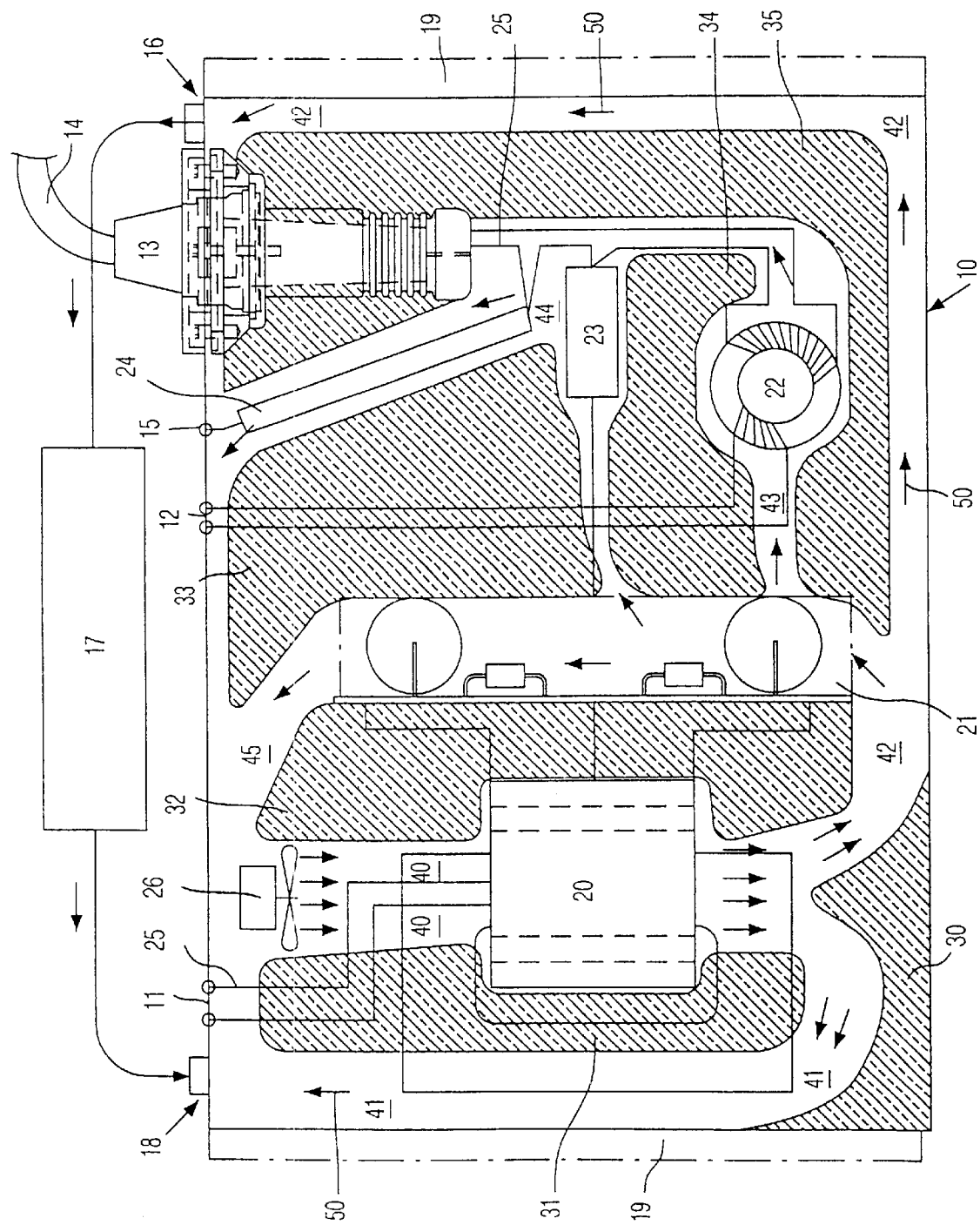

HIGH-VOLTAGE GENERATOR PROVIDED WITH A HYBRID INSULATION

The invention relates to a high-voltage generator which is provided with a hybrid insulation and is intended notably for rotating X-ray systems involving a high speed of rotation and also for systems in which the high-voltage generator is integrated with an X-ray system so as to form one unit (a so-called single-tank generator).

Generally speaking, X-ray systems include an X-ray source with an X-ray tube for generating X-rays as well as a high-voltage generator which delivers the high voltage necessary for operation of the X-ray tube.

Low weight is particularly important for rotating X-ray systems as used, for example, in computed tomography apparatus (CT apparatus). Such systems notably operate with a speed of rotation amounting to several revolutions per second, for example, subsecond scanners in which centrifugal forces of 30 G or more may occur.

JP-A-06 111 991 discloses an X-ray system provided with a hybrid insulation which is formed by an-insulating oil for the X-ray tube and an insulating gas under a high pressure for the high-voltage generator. The insulating means used for the high-voltage generator consists of a gas in order to reduce the quantity of oil and hence the weight. It is a drawback of this system, however, that it requires an appropriate pressure vessel which may lead to significant additional costs, and that the thermal loadability, and hence also the electrical loadability, is comparatively low because, in comparison with oil, the gas is capable of discharging heat to a very limited extent only.

Therefore, it is an object of the present invention to provide a high-voltage generator which is capable of generating a significantly higher electric output power, its weight being low nevertheless.

This object is achieved by means of a high-voltage generator which is provided with a hybrid insulation which includes at least one insulating member which is shaped and arranged in such a manner that there is formed a plurality of interconnected flow channels for an insulating liquid, the cross-sections of said channels being proportioned such that, in comparison with other areas, a higher flow speed can be realized in areas with a high field strength and/or a strong development of heat in the operating condition.

A special advantage of this solution consists in that the formation of flow channels results in a significantly higher discharge of heat, that is, a significantly higher thermal effectiveness of the flow-type insulating medium (in areas exposed to particularly high thermal loads).

Moreover, the electric strength (in areas with a particularly high field strength) is increased in that on the one hand the higher flow speed and the configuration of the channels significantly reduces the probability of formation of fiber bridges, being a frequent cause of voltage flash-over, and on the other hand the direct path between the components carrying the high voltage and ground potential is interrupted by the insulating member.

As a result of the foregoing, the power density, that is, the ratio of the (maximum) output power to the size or the weight of the high-voltage generator, can be significantly increased.

Granted, U.S. Pat. No. 5,497,409 discloses a "radiogenic unit" consisting of a single-pole X-ray tube and other components that are arranged in a given manner and are enclosed by a liquid cooling medium as well as a synthetic material. The aim is to improve the cooling in conjunction with other steps. However, therein the weight of the unit in relation to the output power and the voltage strength is of no importance; moreover, no use is made of different flow speeds, notably at the area of the high-voltage components of the high-voltage generator.

Advantageous further embodiments of the invention are disclosed in the dependent claims.

The voltage generation in conformity with claim 2 is particularly suitable for an embodiment having a comparatively low output power and offers the advantage that it does not require additional devices such as, for example, pumps.

The embodiment disclosed in claim 3 is particularly advantageous, because on the one hand use can be made of the positive properties of an insulating liquid such as, for example, a high thermal conductivity in the case of flow and a high electric strength as well as self-restoration in the case of a voltage flash-over, while on the other hand the essential drawback of the generally comparatively high weight has to be accepted to a very small extent only, since the quantity of insulating liquid can be reduced significantly further as its effectiveness is enhanced by the flow.

The embodiment disclosed in claim 4 offers the advantages that on the one hand the surface of such a high resistance foam is very smooth, so that the flow of the insulating liquid is hardly impeded whereas on the other hand a very high electric strength can be achieved because of the microporosity.

The embodiment disclosed in claim 5 also enhances the electric strength of the overall system further, because the electric field lines at the interface between the insulating member and the insulating liquid are not interrupted to any significant extent, thus avoiding the inherent negative surface effects such as the formation of space charges as well as tangential components of the field strength along the interface.

The embodiment of claim 6 is particularly advantageous when the main object is to minimize the weight of the high-voltage generator.

The discharging of heat is particularly high in the embodiments in conformity with the claims 7 to 10, so that comparatively high output powers can be realized.

Finally, it is to be noted that the high-voltage generator in accordance with the invention can be combined with practically any type of X-ray source so as to form an X-ray system, because its continuous power can be scaled within broad limits by appropriate configuration in conformity with the above description. This also holds for the use in a computed tomography apparatus for which the high-voltage generator can be proportioned so as to have a particularly low weight.

Further details, features and advantages of the invention will become apparent from the following description of a preferred embodiment and the accompanying drawing. Therein:

FIG. 1 is a diagrammatic sectional view of such an embodiment.

The high-voltage generator in accordance with the invention includes a housing 10 with a first input terminal 11 for a first input voltage that is to be converted into the high voltage, a second input terminal 12 for a second input voltage that is to be converted into a filament voltage, a first output terminal 13 for connection to an X-ray tube via a high-voltage cable 14, a second output terminal 15 which carries a measuring voltage, and an outlet 16 for an insulating liquid 50 which is conducted via a heat exchanger 17 and back into the housing 10 again via an inlet 18. Cooling ribs 19 or separate cooling members are provided on the external walls of the housing 10.

The housing 10 accommodates the essential electric components of the high-voltage generator, that is, a transformer 20 or possibly a voltage cascade 21, a filament transformer 22, a damping resistor 23 as well as a measuring divider 24 via which various leads 25 are connected in known manner to the input terminals 11, 12, the output terminal 13 as well as to one another.

The transformer 20 and the voltage cascade 21 convert the first input voltage, present on the first input terminal 11, into a high voltage which is applied to the output terminal 13 via the damping resistor 23. Furthermore, the filament transformer 22 converts the second input voltage, present on the second input terminal 12, a filament voltage which is suitable for a cathode of the X-ray tube and is also applied to the output terminal 13. The functions and the dimensions of such a high-voltage generator are generally known and, therefore, will not be elaborated herein.

In accordance with the invention the housing 10 is provided with a plurality of insulating members 30, 31, 32, 33, 34 and 35 which are arranged and shaped in such a manner that there are formed channels 40, 41, 42, 43, 44.

Part of these channels, that is, the channels 40, 43, 44 and 45, are feed channels that lead to the parts of the high-voltage generator in which a substantial development of heat occurs in the operating condition and/or in which a high electric field strength is produced. These areas are first of all the areas in which the transformer 20 and the voltage cascade 21 are situated, and secondly the filament transformer 22, the damping resistor 23 as well as the measuring divider 24.

The other two channels 41, 42 are return channels, an essential part of the length of which is guided along the external walls of the housing 10 that are provided with the cooling members 19.

The channels are interconnected in such a manner that there is formed a plurality of closed circuits in which the insulating liquid 50, preferably being an insulating liquid that is suitable for a high voltage, for example an insulating oil, silicon or an ester liquid, can circulate. Moreover, the channels are routed in such a manner that the circulation is initiated primarily by convection, that is, by taking up heat in the areas with a strong heat development and by transferring heat to the external walls and via the cooling members 19 of the housing. The circulation can be initiated or at least supported secondarily also by the natural movement of the insulating liquid under the influence of high field strengths as they occur, for example, on the voltage cascade 21.

In order to enhance the effectiveness of these flows, the cross-sections of the return channels 41, 42 are preferably larger than the cross-sections of the feed channels 40, 43, 44 and 45. Consequently, the flow speed in the feed channels is higher, so that on the one hand the heat can be discharged faster while on the other hand the probability of formation of fiber bridges (along which voltage flash-overs preferably occur) is reduced, so that the thermal as well as the electrical strength of these areas is enhanced. The larger cross-sections of the return channels, being routed in such a manner that a maximum area of contact with the external wall of the housing is obtained, lead to a lower flow speed and a suitable transfer of heat from the insulating medium to the environment of the housing.

Moreover, the cross-sections of-the feed channels 40, 43, 44 and 45, of course, may also be different per se. It makes sense to utilize a cross-section which is smaller in comparison with other areas, thus resulting in a higher flow speed, in areas of higher field strength and/or greater heat development, that is, notably near the transformer 20, the filament transformer 22, the damping resistor 23 and the measuring divider 24.

Generally speaking, for a first, comparatively low power range of the high-voltage generator these flow conditions suffice to ensure reliable operation. This first power range extends, for example up to a continuous power of approximately 1 kW. For a second, central power range with a continuous power of up to approximately 2 kW a first propagation device 26 is provided in the housing 10 in order to increase the flow speed in the channels; this device can be realized, for example in the form of a simple pump. For a third, high power range the insulating liquid 50 is returned to the flow circuit again via the outlet 16, the heat exchanger 17 and the inlet 18. The heat exchanger 17 may additionally include a second propagation device (pump) whereby the insulating liquid is pumped therethrough. Appropriate switching of this second propagation device, and possibly of the first propagation device 26, enables adjustment of a plurality of power stages in the high power range, for example, said stages being situated at approximately 3.5 kW, 7 kW and 15 kW.

The insulating members 30, 31, 32, 33, 34 and 35 are made of a microporous high resistance foam. The high resistance foam contains a large number of micro spheres (bubbles) that are formed by a polymer envelope and enclose a gas. In the initial state these spheres have a diameter of approximately 10 $\mu$m. Under the influence of heating of the high resistance foam the spheres expand to a diameter of up to 40 $\mu$m, depending on the temperature. Because the electric breakdown strength of such a high resistance foam is determined essentially by the diameter of the spheres, the high resistance foam is heated to such a temperature only that an optimum value is obtained for the electric strength as well as the desired dielectric constant.

The dielectric constant should correspond essentially to that of the insulating liquid in order to ensure that the electric field lines at the interface between the high-resistance foam and the insulating liquid are not interrupted to any significant extent and that no negative surface effects such as the formation of space charges as well as tangential components of the field strength occur along the interface. The electric strength of the entire system is thus further enhanced.

The adaptation of the dielectric constant can also be realized in known manner by an appropriate choice of the gas contents and the gas composition in the spheres.

The high-resistance foam is preferably formed so as to have closed cells, resulting in a particularly smooth surface along which the insulating liquid can flow without experiencing a high resistance and without penetrating the foam.

In order to minimize the required quantity of oil and hence the overall weight of the high-voltage generator, in the case of the (generally preferred) use of an insulating liquid in the form of oil, the insulating members 30, 31, 32, 33, 34 and 35 fill, as far as possible, all areas with a comparatively low heat development and a low field strength. The channels for the insulating medium extend only at the areas where a heat discharge or an electric strength that is adequate for reliable operation cannot be achieved by means of an insulating member alone.

This embodiment enables the implementation of a very compact high-voltage generator that can operate with a very high continuous power and has a high output power and a comparatively small volume and a low weight.

Because of the deliberate discharge of heat from areas with a high electric and thermal load, it is also possible to fit the high-voltage generator with standard electric components and to realize the power to be output, and hence also the inherent loss power, for completely different applications. Such applications extend from simple radiography with a continuous power of only a few 100 W to cardio-vascular applications with continuous powers of between 2 and 5 kW and further to high-class computed tomography apparatus with a continuous power of up to 15 kW and high speeds of rotation.

The principle of the hybrid insulation, of course, can also be used for other high-voltage systems, for example, in sub-stations.

What is claimed is:

1. A high-voltage generator comprising a hybrid insulation, wherein the hybrid insulation includes at least one insulating member which is shaped and arranged in such a manner that there is formed a plurality of interconnected flow channels for an insulating liquid, the cross-sections of said channels being proportioned such that in comparison with other areas a higher flow speed can be realized in areas with a high field strength or a strong development of heat in the operating condition.

2. A high-voltage generator as claimed in claim 1, wherein the at least one insulating member is shaped and arranged in such a manner that the insulating liquid flows through the flow channels under the influence of convection or natural movement due to the effect of a field generated by the high-voltage generator in the operating condition.

3. A high-voltage generator as claimed in claim 1, wherein the insulating liquid is a high-voltage-resistant insulating liquid.

4. A high-voltage generator as claimed in claim 1, wherein the at least one insulating member is made of a microporous, closed-cell high-resistance foam.

5. A high-voltage generator as claimed in claim 1, wherein the at least one insulating member and the insulating liquid have essentially the same dielectric constant.

6. A high-voltage generator as claimed in claim 1, wherein the at least one insulating member fills essentially all areas with a small development of heat and a low field strength in the operating condition.

7. A high-voltage generator as claimed in claim 1, wherein the at least one insulating member is formed and arranged in such a manner that the insulating liquid can flow in an essentially closed circuit, return channels extending along one or more external walls of the housing of the high-voltage generator.

8. A high-voltage generator as claimed in claim 7, wherein the return channels have a larger cross-section in comparison with the other channels.

9. A high-voltage generator as claimed in claim 1, wherein there is provided a first propagation device for propagating the insulating liquid through the channels.

10. A high-voltage generator as claimed in claim 1, further comprising a heat exchanger for conducting the insulating liquid.

11. A computed tomography apparatus which includes an X-ray system, wherein a high-voltage generator as claimed in any one of the claims 1 to 10 is provided for operation of the X-ray system.

12. An X-ray system comprising an X-ray source and a high-voltage generator provided with a hybrid insulation which includes at least one insulating member which is shaped and arranged in such a manner that there is formed a plurality of interconnected flow channels for an insulating liquid, the cross-sections of said channels being proportioned such that in comparison with other areas a higher flow speed can be realized in areas with a high field strength or a strong development of heat in the operating condition.

* * * * *